(12) United States Patent
Yamaguchi et al.

(10) Patent No.: US 11,801,556 B2
(45) Date of Patent: Oct. 31, 2023

(54) METAL PARTICLE AGGREGATES, METHOD FOR PRODUCING SAME, PASTE-LIKE METAL PARTICLE AGGREGATE COMPOSITION, AND METHOD FOR PRODUCING BONDED BODY USING SAID PASTE-LIKE METAL PARTICLE AGGREGATE COMPOSITION

(71) Applicant: MITSUBISHI MATERIALS CORPORATION, Tokyo (JP)

(72) Inventors: Tomohiko Yamaguchi, Naka (JP); Koutarou Masuyama, Naka (JP); Kazuhiko Yamasaki, Naka (JP); Akihiro Higami, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 688 days.

(21) Appl. No.: 16/978,436

(22) PCT Filed: Feb. 15, 2019

(86) PCT No.: PCT/JP2019/005559
§ 371 (c)(1),
(2) Date: Sep. 4, 2020

(87) PCT Pub. No.: WO2019/171908
PCT Pub. Date: Sep. 12, 2019

(65) Prior Publication Data
US 2021/0050319 A1    Feb. 18, 2021

(30) Foreign Application Priority Data

Mar. 6, 2018    (JP) .................. 2018-039518

(51) Int. Cl.
*B23K 35/00*    (2006.01)
*B22F 9/24*    (2006.01)
(Continued)

(52) U.S. Cl.
CPC ............... *B22F 9/24* (2013.01); *B22F 1/052* (2022.01); *B22F 1/054* (2022.01); *B22F 1/056* (2022.01);
(Continued)

(58) Field of Classification Search
CPC ......... H01L 2224/8384; H01L 2224/32; H01L 2224/2612; H01L 24/29; H01L 24/83;
(Continued)

(56) References Cited

U.S. PATENT DOCUMENTS

2008/0173398 A1    7/2008    Yasuda et al.
2009/0236404 A1    9/2009    Yamakawa et al.
(Continued)

FOREIGN PATENT DOCUMENTS

CN    102651248 A    8/2012
CN    103250236 A    8/2013
(Continued)

OTHER PUBLICATIONS

Supplementary European Search Report dated Oct. 20, 2021, issued for European Patent Application No. 19763382.9.
(Continued)

*Primary Examiner* — Kiley S Stoner
(74) *Attorney, Agent, or Firm* — Locke Lord LLP

(57) ABSTRACT

A metal particle aggregate includes metal particles and an organic substance. The metal particles include first particles that contain one or both of silver and copper in an amount of 70% by mass or more relative to 100% by mass of all metals and have a particle diameter of 100 nm or more and less than 500 nm at a ratio of 20 to 30% by number, and include second particles that have a particle diameter of 50 nm or more and less than 100 nm, and third particles that have a particle diameter of less than 50 nm at a ratio of 80

(Continued)

to 70% by number in total. Surfaces of the first to third particles are covered with the same protective film.

8 Claims, 5 Drawing Sheets

(51) Int. Cl.
  *B23K 35/02*  (2006.01)
  *B23K 35/30*  (2006.01)
  *H01L 23/00*  (2006.01)
  *B22F 1/16*  (2022.01)
  *B22F 1/054*  (2022.01)
  *B22F 1/107*  (2022.01)
  *B22F 1/10*  (2022.01)
  *B22F 1/148*  (2022.01)
  *B22F 1/052*  (2022.01)

(52) U.S. Cl.
CPC ............... *B22F 1/10* (2022.01); *B22F 1/107* (2022.01); *B22F 1/148* (2022.01); *B22F 1/16* (2022.01); *B23K 35/025* (2013.01); *B23K 35/302* (2013.01); *B23K 35/3006* (2013.01); *H01L 24/29* (2013.01); *H01L 24/83* (2013.01); *B22F 2301/10* (2013.01); *B22F 2301/255* (2013.01); *B22F 2302/45* (2013.01); *B22F 2304/056* (2013.01); *B22F 2304/058* (2013.01); *H01L 2224/29239* (2013.01); *H01L 2224/29247* (2013.01); *H01L 2224/8384* (2013.01)

(58) Field of Classification Search
CPC . H01L 2224/29239; H01L 2224/29247; B22F 2007/047; B22F 7/04; B22F 2998/10; B22F 9/24; B22F 1/052; B22F 1/054; B22F 1/056; B22F 1/10; B22F 1/107; B22F 1/148; B22F 1/16; B22F 2301/10; B22F 2301/255; B22F 2302/45; B22F 2304/056; B22F 2304/058; H01B 1/02; H01B 1/22; H01B 13/00; B82Y 30/00; B82Y 40/00; B23K 35/025; B23K 35/3006; B23K 35/302; B23K 3/0638; B23K 35/044
USPC ............................................ 228/248.1–248.5
See application file for complete search history.

(56) References Cited

U.S. PATENT DOCUMENTS

| | | | |
|---|---|---|---|
| 2010/0124514 A1* | 5/2010 | Chelluri | B22F 1/052 419/33 |
| 2012/0107628 A1 | 5/2012 | Komatsu et al. | |
| 2013/0323529 A1 | 12/2013 | Kurita et al. | |
| 2015/0028085 A1 | 1/2015 | Endoh et al. | |
| 2016/0121432 A1 | 5/2016 | Watanabe et al. | |
| 2016/0168351 A1* | 6/2016 | Xiu | H01L 23/295 523/400 |
| 2017/0144220 A1* | 5/2017 | Suganuma | H01B 1/22 |
| 2017/0327701 A1* | 11/2017 | Connor | B22F 1/107 |
| 2018/0033515 A1 | 2/2018 | Masuyama et al. | |
| 2019/0002719 A1* | 1/2019 | Pousthomis | C09K 11/703 |

FOREIGN PATENT DOCUMENTS

| | | | | |
|---|---|---|---|---|
| CN | 107206490 A | | 9/2017 | |
| CN | 108754266 A | * | 11/2018 | ............... B22F 3/14 |
| EP | 2587899 A1 | * | 5/2013 | ............ B22F 1/0018 |
| EP | 3217424 A1 | * | 9/2017 | ............... B22F 7/08 |
| EP | 3476458 A1 | * | 5/2019 | ......... B01D 39/2079 |
| EP | 3711879 A1 | * | 9/2020 | ............... B22F 1/00 |
| EP | 2839904 B1 | * | 12/2020 | ............ B22F 1/0003 |
| JP | 2008-161907 A | | 7/2008 | |
| JP | 4347381 B2 | | 10/2009 | |
| JP | 2010-229544 A | | 10/2010 | |
| JP | 2011-094223 A | | 5/2011 | |
| JP | 4770533 B2 | * | 9/2011 | ............. H01L 24/29 |
| JP | 5620122 B2 | * | 11/2014 | |
| JP | 2016-011448 A | | 1/2016 | |
| JP | 2016-148089 A | | 8/2016 | |
| JP | 5976684 B2 | | 8/2016 | |
| JP | 2017-031470 A | | 2/2017 | |
| JP | 2017-111975 A | | 6/2017 | |
| JP | 2018059192 A | * | 4/2018 | ............... B22F 1/00 |
| KR | 20160090603 A | * | 2/2016 | |
| KR | 20160044014 A | * | 4/2016 | |
| KR | 2017010928 A | * | 2/2017 | ............... H01B 1/16 |
| KR | 10-2017-0118057 A | | 10/2017 | |
| KR | 10-2018-0004853 A | | 1/2018 | |
| WO | 2006/126614 A1 | | 11/2006 | |
| WO | 2007/034833 A1 | | 3/2007 | |
| WO | 2013/108408 A1 | | 7/2013 | |
| WO | 2014/185073 A1 | | 11/2014 | |
| WO | WO-2018062220 A1 | * | 4/2018 | ............... B22F 1/00 |
| WO | WO-2019092959 A1 | * | 5/2019 | ............... B22F 1/00 |
| WO | WO-2021125161 A1 | * | 6/2021 | |

OTHER PUBLICATIONS

Office Action dated Jul. 21, 2021, issued for Japanese Application No. 2018-039518 and its English machine translation.
Office Action dated Sep. 2, 2022, issued for Chinese Patent Application No. 201980009209.5 and a Partial English translation of the Search Report.
Modern Scientific Instruments, Issue Z1, Lin Mingzhang, Zhu Qingshi, Liquid Phase Nanochemistry, 1998, pp. 17-23 and 43 and English abstract. (cited in the May 31, 2023 Notice of Allowance issued for CN201980009209.5).
Notice of Allowance dated May 31, 2023, issued for CN201980009209.5 and English translation of the Search Report.
Notice of Allowance dated Jul. 22, 2022, issued for Koreant Patent Application No. 10-2020-7023340 and English translation thereof.

* cited by examiner

Example 1

Comparative Example 1

Comparative Example 2

Comparative Example 3

Comparative Example 4

METAL PARTICLE AGGREGATES, METHOD FOR PRODUCING SAME, PASTE-LIKE METAL PARTICLE AGGREGATE COMPOSITION, AND METHOD FOR PRODUCING BONDED BODY USING SAID PASTE-LIKE METAL PARTICLE AGGREGATE COMPOSITION

TECHNICAL FIELD

The present invention relates to a metal particle aggregate, a method for producing the metal particle aggregate, a paste-like metal particle aggregate composition containing the metal particle aggregate, and a method for producing a bonded body using the paste-like metal particle aggregate composition. This international application claims priority of Japanese Patent Application No. 39518 (Japanese Patent Application No. 2018-39518), filed Mar. 6, 2018, the content of which is incorporated herein.

BACKGROUND ART

When two or more components are bonded to each other in assembly or mounting of electronic components, a bonding material is generally used. As such a bonding material, a paste-like bonding material that is obtained by dispersing metal particles having high thermal conductivity such as silver and gold in a volatile solvent is known. When the components are bonded to each other using the bonding material, the bonding material is applied to a surface of one of the components, the other thereof is contacted with the applied surface, and the components are subjected to a heat treatment in this state. By the heat treatment, the metal particles are sintered to produce a bonding layer. As a result, the components can be bonded to each other.

As the bonding material, a bonding material using metal particles having a particle diameter of submicron size (for example, see Patent Documents 1 and 2), a bonding material using an aggregate that is obtained by aggregating metal particles having a particle diameter of nano size (for example, see Patent Documents 3 and 4), and the like are disclosed. Patent Document 1 describes a bonding material using silver spherical particles having an average particle diameter of 0.1 to 6 μm. Patent Document 2 describes a bonding material using silver non-spherical particles having an average particle diameter of 0.1 to 18 μm. Patent Document 3 describes a bonding material containing metal particles of which a surface is coated with an organic substance and that have an average particle diameter of 1 nm or more and 100 nm or less, and an aggregate that is formed by aggregating the metal particles and has a particle diameter of 10 nm or more and 100 μm or less. Further, Patent Document 4 describes a bonding material containing metal nanoparticles having a number average particle diameter of 50 nm or less and a particle diameter of 100 to 200 nm, a flocculant aid, and a high polymer dispersant.

The bonding strength of the bonding material using metal particles of submicron size, which are described in Patent Documents 1 and 2, tends to be lower than that of the bonding material using an aggregate formed by aggregating metal particles of nano size, which are described in Patent Documents 3 and 4. This is considered because a gap between the metal particles of submicron size is larger than that between the metal particles of nano size, and therefore fine voids are easily generated in a bonding layer formed by firing the bonding material using the metal particles of submicron size. In order to suppress the generation of the voids, there is a method for pressurizing members that are substances to be bonded, such as electronic components, during bonding. In this case, pressurization equipment is required.

On the other hand, the bonding strength of the bonding material using the metal particles of nano size, which are described in Patent Documents 3 and 4, is decreased with time, and therefore the long-term reliability may be deteriorated. This is considered because the bonding material using the metal particles of nano size generally contains a protectant (organic substance) for suppressing aggregation on a surface of the metal particles of nano size, and the protectant remains in a bonding layer, and is decomposed with time to generate voids in the bonding layer, decreasing the bonding strength.

In order to solve these problems, a composition for metal bonding using two or more kinds of metal particles having different average particle diameters is disclosed (for example, see Patent Document 5). The composition for metal bonding described in Patent Document 5 contains two or more kinds of metal particles having different average particle diameters, an organic component, and a dispersant, wherein a particle diameter ratio ($D_S/D_L$) of an average particle diameter $D_S$ of metal particles S that have the smallest average particle diameter to an average particle diameter $D_L$ of metal particles L that have the largest average particle diameter is $1 \times 10^{-4}$ to 0.5, and a combination of the average particle diameter ratio of the metal particles is optimized. In the composition for metal bonding having such a configuration, high bonding strength can be achieved by bonding at relatively low temperature without pressurization. In addition, a composition for metal bonding having heat resistance in which a decrease in bonding strength due to decomposition, degradation, or the like of a resin component during an increase in use temperature is unlikely to occur can be obtained.

PRIOR ART LIST

Patent Documents

Patent Document 1: International publication WO 2006/126614 (claim 1)
Patent Document 2: International publication WO 2007/034833 (claim 1)
Patent Document 3: Japanese Patent Application Laid-Open No. 2008-161907 (claims 1 and 7)
Patent Document 4: Japanese Patent Application Laid-Open No. 2011-94223 (claims 1 and 3)
Patent Document 5: International publication WO 2014/185073 (claim 1, paragraphs [0012] and [0018])

SUMMARY OF INVENTION

Problems to be Solved by the Invention

In the conventional composition for metal bonding described in Patent Document 5, a mixed powder of nanoparticles and submicron particles is used to form a bonding layer on a substrate at relatively low firing temperature. However, the respective particles are produced in separate reaction fields. In general, the powders of the nanoparticles having a smaller particle diameter are easily aggregated due to high surface energy, and therefore it is necessary to secure dispersibility. Therefore, a rigid surface protective film is formed for suppression of aggregation of the powders, and the detachment temperature of the protective film due to thermal decomposition is increased. Accordingly, detachment of the surface protective film by thermal decomposition becomes rate-determining rather than an effect of particle diameter having low-temperature sintering properties. There is a problem in which sufficient low-temperature sintering cannot be achieved even when the metal particles having a nano particle diameter and the metal particles having a submicron particle diameter are mixed.

It is an object of the present invention to provide a metal particle aggregate in which a bonding layer of bonding members such as electronic components can be sintered at relatively low temperature and the bonding strength of the members such as electronic components through the bonding layer can be enhanced, a method for producing the metal particle aggregate, a paste-like metal particle aggregate composition, and a method for producing a bonded body using the same.

Means for Solving the Problems

A first aspect of the present invention is a metal particle aggregate including metal particles including first particles that contain either one or both of silver and copper in an amount of 70% by mass or more relative to 100% by mass of all metals and have a particle diameter of 100 nm or more and less than 500 nm at a ratio of 20 to 30% by number, and second particles that have a particle diameter of 50 nm or more and less than 100 nm, and third particles that have a particle diameter of less than 50 nm at a ratio of 80 to 70% by number in total, and an organic substance, and surfaces of the first to third particles are covered with the same protective film.

A second aspect of the present invention is the invention according to the first aspect, wherein the second particles are contained at a ratio of 55 to 65% by number, and the third particles are contained at a ratio of 5 to 25% by number.

A third aspect of the present invention is a method for producing the metal particle aggregate comprising steps of: adding dropwise a metal salt aqueous solution containing one or both of silver and copper and a carboxylate aqueous solution to water, to prepare a metal carboxylate slurry; adding dropwise an aqueous solution of organic reductant to the metal carboxylate slurry, and performing a heat treatment for reduction in which the temperature is increased to a predetermined temperature within a range of 65° C. or higher and 85° C. or lower at a temperature increasing rate of more than 15° C./hour and 40° C./hour or less and kept at this temperature for 2 hours or more and 3 hours or less to generate and aggregate metal particles into a metal particle aggregate; and drying the metal particle aggregate, wherein the metal particles in the metal particle aggregate includes first particles that contain one or both of silver and copper in an amount of 70% by mass or more relative to 100% by mass of all metals and has a particle diameter of 100 nm or more and less than 500 nm at a ratio of 20 to 30% by number, second particles that have a particle diameter of 50 nm or more and less than 100 nm, and third particles that have a particle diameter of less than 50 nm at a ratio of 80 to 70% by number in total.

A fourth aspect of the present invention is the invention according to the third aspect, wherein the second particles are contained at a ratio of 55 to 65% by number, and the third particles are contained at a ratio of 25 to 5% by number.

A fifth aspect of the present invention is a paste-like metal particle aggregate composition including the metal particle aggregate according to the first or second aspect and a volatile solvent.

A sixth aspect of the present invention is a method for producing a bonded body by bonding a first member and a second member through a bonding layer, wherein the bonding layer is formed using the paste-like metal particle aggregate composition according to the fifth aspect.

Advantageous Effects of Invention

In the metal particle aggregate of the first aspect of the present invention, the second particles and the third particles are contained at a ratio of 80 to 70% by number in total, and the surfaces of the first to third particles are covered with the same protective film. Therefore, when a paste layer is formed from the paste-like metal particle aggregate composition using the metal particle aggregate, and sintered to prepare a bonding layer, the protective films of the first to third particles are detached at relatively low temperature, to expose metal surfaces of the first to third particles. The metal powder surfaces of the second and third particles (nanoparticles) having a smaller particle diameter are preferentially activated, and sintered. At this time, the particle diameter becomes rate-determining. The first particles (submicron particles) having a larger particle diameter that are hardly sintered are sintered when the temperature is increased to a certain temperature that is a relatively low temperature. Therefore, a bonding layer having high bonding strength can be sintered at relatively low temperature. That is, a bonding layer for bonding members such as electronic components can be sintered at relatively low temperature.

In the method for producing the metal particle aggregate of the third aspect of the present invention, the second particles and the third particles are contained at a ratio of 80 to 70% by number in total, and the protective films covering the surfaces of the first to third particles are formed at the same reaction field. In the same manner as above, when a paste layer is formed from the paste-like metal particle aggregate composition using the metal particle aggregate, and sintered to prepare a bonding layer, the protective films of the first to third particles are detached at relatively low temperature, to expose metal surfaces of the first to third particles. The metal powder surfaces of the second and third particles (nanoparticles) having a smaller particle diameter are preferentially activated, and sintered. At this time, the particle diameter becomes rate-determining. The first particles (submicron particles) having a larger particle diameter that are hardly sintered are sintered when the temperature is increased to a certain temperature that is a relatively low temperature. In the same manner as above, a bonding layer having high bonding strength can be sintered at relatively low temperature. That is, a bonding layer for bonding members such as electronic components can be sintered at relatively low temperature.

DESCRIPTION OF EMBODIMENTS

Figure 1:
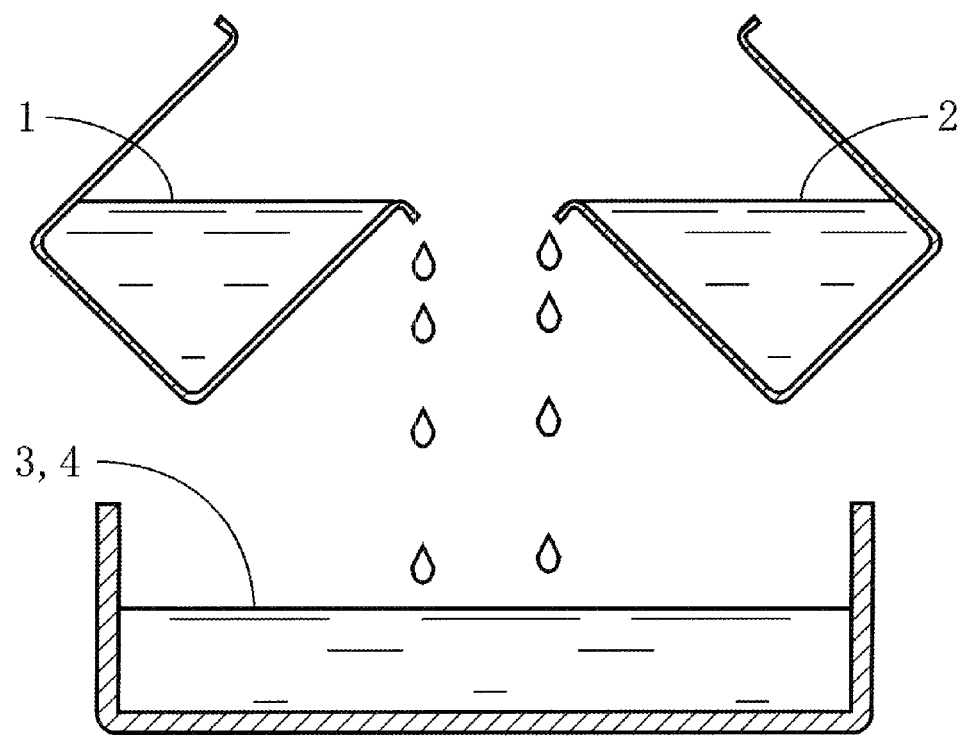
FIG. 1 is a schematic view illustrating a state where a metal salt aqueous solution and a carboxylate aqueous solution are simultaneously added dropwise to water (ion-exchanged water) in an embodiment (Example) of the present invention to prepare a metal carboxylate slurry.

Hereinafter, embodiments of the present invention will be described on the basis of the drawings.

<Metal Particle Aggregate>

A metal particle aggregate includes metal particles and an organic substance. The metal particles (primary particles) contain one or both of silver and copper in an amount of 70% by mass or more, preferably 90% by mass or more, and further preferably 99% by mass or more, relative to 100% by mass of all metals. Herein, the content ratio of the metal particles is limited to the aforementioned range. This is because as the purity of metal particles is higher, sintering is advanced at relatively low temperature, and a bonded body can be formed.

The metal particles include first particles having a particle diameter of 100 nm or more and less than 500 nm at a ratio of 20 to 30% by number, and include second particles having a particle diameter of 50 nm or more and less than 100 nm and third particles having a particle diameter of less than 50 nm at a ratio of 80 to 70% by number in total. Herein, the content ratio of the first particles and the content ratio of the second particles and the third particles are each limited to the aforementioned ranges. This is because the second and third particles (nanoparticles) that constitute a major portion determine low-temperature sintering properties and rheology, and the first particles in a small amount slightly decrease viscosity and thixotropy. When the content ratios fall within the aforementioned ranges, favorable paste viscosity and low-temperature sintering properties can be achieved. The metal particle aggregate does not contain particles having a particle diameter of 500 nm or more, or if the metal particle aggregate contains the particles, the content ratio thereof is less than 1% by number.

The particle diameters of the first to fourth particles are a diameter equivalent to a circle (a diameter of a circle having the same area as the projected area of the metal particles) obtained by measurement of the projected area of metal particles with a scanning electron microscope (SEM) and calculation from the projected area. The particle size distributions of the first to fourth particles can be determined as follows. A predetermined number of (e.g., 500) images of a metal particle aggregate are first obtained using a scanning electron microscope (SEM), the particle diameters of the metal particles contained in each of the metal particle aggregate are measured, and the metal particles in which the whole profile of the metal particles (primary particles) can be visually recognized are extracted from the SEM images of the metal particle aggregate. Subsequently, the projected areas of the extracted metal particles are measured using an image processing soft (Image-J), and the diameters equivalent to a circle are calculated from the obtained projected areas as the particle diameters of the metal particles. Further, the metal particles are classified into the first particles having a particle diameter of 100 nm or more and less than 500 nm, the second particles having a particle diameter of 50 nm or more and less than 100 nm, the third particles having a particle diameter of less than 50 nm, and the fourth particles having a particle diameter of 500 nm or more, and the content ratios of the first to fourth particles by number are calculated. On the other hand, the particle size distribution of the metal particle aggregate can be determined as follows. First, the metal particle aggregate is added to water, irradiated with ultrasonic wave with a predetermined frequency, and dispersed in water. Subsequently, an appropriate amount of the obtained dispersion liquid of the metal particle aggregate is added to an observation cell of a laser diffraction scattering particle size distribution analyzer (HORIBA Ltd., LA-960), and the particle size distribution is measured in accordance with a procedure of this analyzer. The particle size distribution measured by a laser diffraction scattering method is the particle size distribution of metal particle aggregate (secondary particles) in which an aggregate of metal particles (primary particles) is considered as one particle.

Surfaces of the first to third particles are covered with the same protective film. Specifically, the first to third particles are produced at the same reaction field, as described below. Therefore, the protective films of the first to third particles are the same, and the thermal degradation temperature are not different. The content ratio of the second particles having a particle diameter of 50 nm or more and less than 100 nm is preferably 55 to 65% by number, and the content ratio of the third particles having a particle diameter of less than 50 nm is preferably 5 to 25% by number. Herein, the content ratio of the second particles and the content ratio of the third particles are each limited to the aforementioned range. This is because the second and third particles (nanoparticles) that constitute a major portion determine low-temperature sintering properties and rheology, and the first particles in a small amount slightly decrease viscosity and thixotropy. When the content ratios fall within the aforementioned ranges, favorable paste viscosity and low-temperature sintering properties can be achieved.

On the other hand, it is preferable that the organic substance in the metal particle aggregate be an organic reductant that is decomposed or volatilized at a relatively low temperature of about 150° C. or a decomposed substance thereof. Examples of the organic reductant include ascorbic acid, formic acid, and tartaric acid. When as the organic substance, the organic reductant or a decomposed substance thereof is contained, effects of suppressing oxidation of surfaces of the metal particles and diffusion of metal atoms during storage of the metal particle aggregate are achieved. When the metal particle aggregate is printed on a surface to be bonded of a member to be bonded and heated, the organic substance is easily decomposed or volatilized, and a highly active surface of the metal particles can be exposed. Thus, an effect of easily promoting a sintering reaction of the metal particles is achieved. Further, a decomposed substance or a volatilized substance that is generated by heating the organic substance has a reduction ability of reducing an oxide film of the surface to be bonded of the member to be bonded. In order to achieve the effects based on the organic substance, the content ratio of the organic substance is preferably 0.05% by mass or more relative to 100% by mass of the metal particles. Provided that the content ratio of the organic substance is limited to an amount of 2% by mass or less relative to 100% by mass of the metal particles. This is because when the organic substance in the metal particle aggregate remains in a bonding layer, the organic substance may be decomposed with time, to generate voids in the bonding layer.

The metal particle aggregate is an aggregate of the metal particles (primary particles). In a particle size distribution curve based on the number that is measured by a laser diffraction scattering method, it is preferable that D10 of the metal particle aggregate be 0.05 μm or more and 0.25 μm or less, D50 thereof be 0.4 μm or more and 0.6 μm or less, and D90 thereof be 1.5 μm or more and 2.5 μm or less. When the metal particle aggregate has a relatively wide particle size distribution as describe above, a dense metal particle aggregate layer in which there is few gap between the metal particle aggregate and another metal particle aggregates can be formed, and a bonding layer having few void can be formed. The specific surface area of the metal particle aggregate is preferably within a range of 2 to 8 $m^2$/g. When the specific surface area of the metal particle aggregate falls within the aforementioned range, the reaction area of the metal particles is increased, and the reactivity to heating is increased. Therefore, the metal particle aggregate can be sintered at relatively low temperature.

<Method for Producing Metal Particle Aggregate>

A method for producing the metal particle aggregate having such a configuration will be described. A metal salt aqueous solution containing one or both of silver and copper and a carboxylate aqueous solution are first added dropwise to water, to prepare a metal carboxylate slurry. Specifically, a metal salt aqueous solution 1 and a carboxylate aqueous solution 2 are simultaneously added dropwise to water 3 to prepare a metal slurry 4 of carboxylic acid, as illustrated in FIG. 1. Examples of a metal salt in the metal salt aqueous solution 1 include silver nitrate, silver chlorate, silver phosphate, copper nitrate, and copper perchlorate. Examples of a carboxylic acid in the carboxylate aqueous solution 2 include oxalic acid, citric acid, and maleic acid. Examples of the water 3 include ion-exchanged water and distilled water. Ion-exchanged water is particularly preferably used since ion-exchanged water does not contain ions that adversely affect a heat treatment for reduction (synthesis) and the production cost of ion-exchanged water is lower than that of distilled water.

Figure 2:
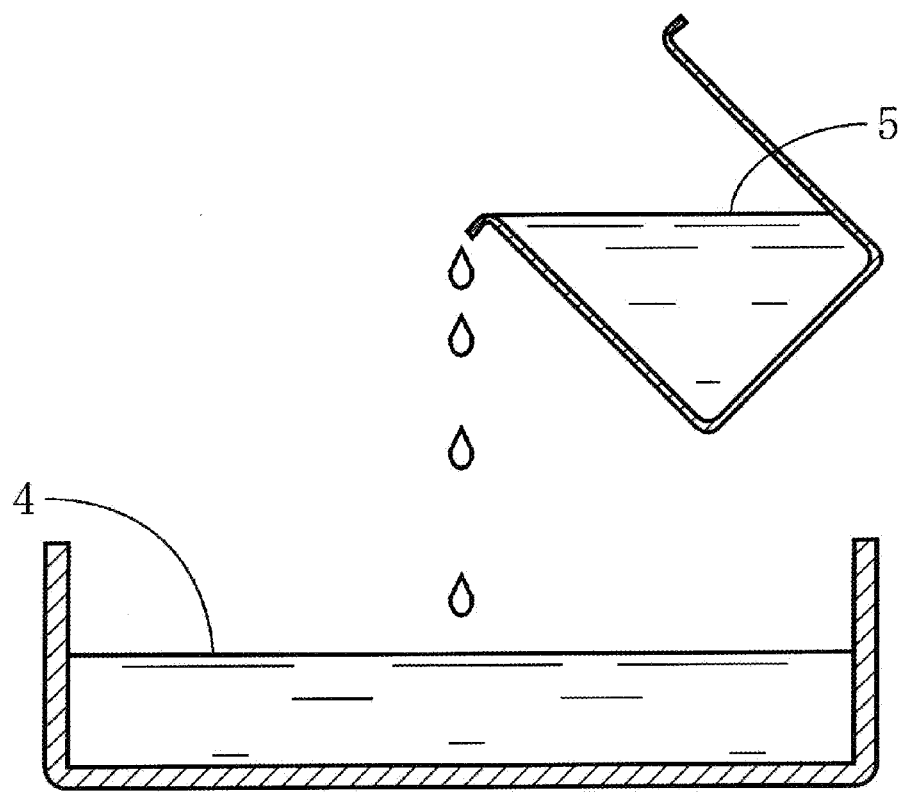
FIG. 2 is a schematic view illustrating a state where an aqueous solution of an organic reductant is added dropwise to the metal carboxylate slurry in the embodiment (Example) of the present invention.

An aqueous solution of an organic reductant is then added dropwise to the metal carboxylate slurry, and a heat treatment for reduction is carried out to obtain a metal particle aggregate. Specifically, an aqueous solution 5 of an organic reductant is added dropwise to the metal carboxylate slurry 4, and a heat treatment for reduction is carried out to obtain a metal particle aggregate, as illustrated in FIG. 2. Examples of the reductant in the aqueous solution 5 of the organic reductant include ascorbic acid, formic acid, tartaric acid, and salts thereof. The heat treatment for reduction is a heat treatment in which the temperature is increased to a predetermined temperature (maximum temperature) within the range of 65° C. or higher and 85° C. or lower at a temperature increasing rate of more than 15° C./hour and 40° C./hour or less in water, and kept at the maximum temperature for 2 hours or more and 3 hours or less. After the maximum temperature is held for a predetermined time, the temperature is decreased to 30° C. or lower. When the temperature increasing rate is 15° C./hour or less, the particle diameters of the respective metal particles in nano aggregates of the second and third particles are uneven, and a desired particle diameter distribution is unlikely to be obtained. When it is more than 40° C./hour, reduction is not completed for a predetermined time. Therefore, the temperature increasing rate is limited to a predetermined temperature within a range of more than 15° C./hour and 40° C./hour or less. When the maximum temperature is lower than 65° C., reduction is not completed for a predetermined time. When it is higher than 85° C., the metal particles are made coarse. Therefore, the maximum temperature is limited to a predetermined temperature within a range of 65° C. or higher and 85° C. or lower. When the holding time at the maximum temperature is less than 2 hours, reduction is not completed, and metal carboxylate remains. When it is more than 3 hours, the metal particles are made coarse. Therefore, the holding time at the maximum temperature is limited to a range of 2 hours or more and 3 hours or less.

It is desirable that the nano aggregates of the second and third particles have certain size. Therefore, it is preferable that during the heat treatment for reduction, the nano aggregates be dispersed to a certain degree by stirring a mixed solution of the metal carboxylate slurry with the reductant aqueous solution. By the heat treatment for reduction (wet reduction process), the metal particles are obtained in an amount of 1% by mass to 20% by mass relative to the whole solution of slurry of the metal particle aggregate. When the amount of the metal particles falls within this range, a bonding layer that finally achieves high bonding strength and has long-term reliability is obtained. Herein, when the amount of the metal particles is more than 20% by mass, the metal particles tend to be made coarse. In this case, the metal particles having a predetermined particle diameter are not obtained.

By the heat treatment for reduction, nucleus of the metal particles are produced on a surface of precursor of the metal salt in the metal carboxylate slurry, and aggregated, to form an aggregate of nanoparticles (the second particles having a particle diameter of 50 nm or more and less than 100 nm and the third particles having a particle diameter of less than 50 nm). A part of the aggregate of the nanoparticles is grown to obtain submicron particles (the first particles having a particle diameter of 100 nm or more and less than 500 nm). Thus, a slurry of the metal particle aggregate containing the nanoparticles (the second particles and the third particles) and the submicron particles (the first particles) is obtained. At a process of growth of the nucleus of the metal particles, aggregation, and particle growth, a part of carboxylic acid in the metal carboxylate slurry forms a protective film that covers the surface of the metal particles. The slurry of the metal particle aggregate is subjected to solid-liquid separation, and a solid material (metal particle aggregate) is collected, washed with water, and dried. Thus, the metal particle aggregate is obtained. The metal particles of the metal particle aggregate includes the first particles that contain one or both of silver and copper in an amount of 70% by mass or more relative to 100% by mass of all metals and have a particle diameter of 100 nm or more and less than 500 nm at a ratio of 20 to 30% by number, and includes the second particles having a particle diameter of 50 nm or more and less than 100 nm and the third particles having a particle diameter of less than 50 nm at a ratio of 80 to 70% by number in total.

Examples of a method for the solid-liquid separation include centrifugal separation, filtrating, and decantation. Examples of a method for drying the solid material (metal particle aggregate) include lyophilization, drying under reduced pressure, and drying under heating. Lyophilization is a method in which a slurry of a metal particle aggregate is placed in a closed container, and frozen, the pressure in the closed container is reduced by a vacuum pump to decrease the boiling point of a material to be dried, and the moisture of the material to be dried is sublimated at low temperature, resulting in drying. Drying under reduced pressure is a method of drying a material to be dried by decompression. Drying under heating is a method of drying a material to be dried by heating.

<Paste-Like Metal Particle Aggregate Composition>

A paste-like metal particle aggregate composition containing the metal particle aggregate and a volatile solvent will be described. Examples of the volatile solvent include an alcohol-based solvent, a glycol-based solvent, an acetate-based solvent, a hydrocarbon-based solvent, and an amine-based solvent. Specific examples of the alcohol-based solvent include α-terpineol, and isopropyl alcohol. Specific examples of the glycol-based solvent include ethylene glycol, diethylene glycol, and polyethylene glycol. Specific examples of the acetate-based solvent include butyl carbitol acetate. Specific examples of the hydrocarbon-based solvent include decane, dodecane, and tetradecane. Specific examples of the amine-based solvent include hexylamine, octylamine, and dodecylamine.

The content of the metal particle aggregate in the paste-like metal particle aggregate compos it ion is preferably 50% by mass or more, and particularly preferably within a range of 70% by mass or more and 95% by mass or less, relative to the whole amount of the paste-like metal particle aggregate composition. When the content of the metal particle aggregate falls within the aforementioned range, the viscosity of the paste-like metal particle aggregate composition is not too low. Therefore, the paste-like metal particle aggregate composition can be stably applied to a surface of a member. When the paste-like metal particle aggregate composition is fired, a fired body (bonding layer) having high density and decreased generation amount of void can be obtained. The paste-like metal particle aggregate composition may further contain an additive such as an antioxidant or a viscosity adjusting agent. The content of the additive is preferably within a ranged of 1% by mass or more and 5% by mass or less relative to 100% by mass of the paste-like metal particle aggregate composition. Further, the paste-like metal particle aggregate composition can be produced, for example, by kneading a mixture obtained by mixing the volatile solvent and the metal particle aggregate using a kneader. Examples of the kneader include a three-roll mill.

<Bonded Body Using Paste-Like Metal Particle Aggregate Composition>

Figure 3:
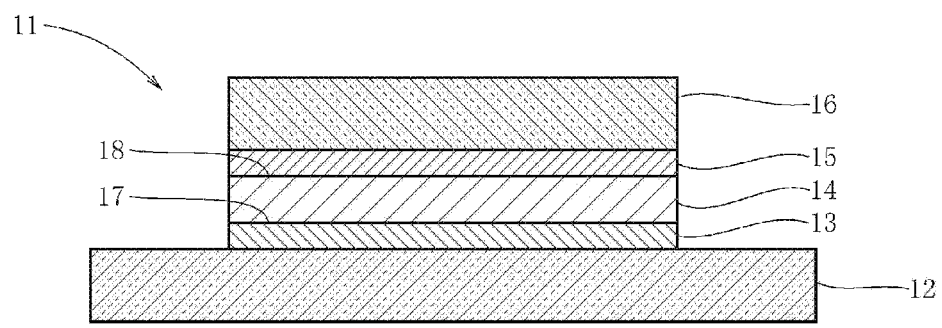
FIG. 3 is a cross-sectional view illustrating an example of a bonded body produced using a paste-like metal particle in an embodiment of the present invention.

A bonded body using the paste-like metal particle aggregate composition having such a configuration will be described based on FIG. 3. As illustrated in FIG. 3, a bonded body 11 includes a substrate 12 (first member), a material to be bonded 16 (second member), and a bonding layer 14 formed using the paste-like metal particle aggregate composition between the substrate 12 and the material to be bonded 16. Specifically, in the bonded body 11, a first metal layer 13 is disposed between the substrate 12 and the bonding layer 14, and a second metal layer 15 is disposed between the material to be bonded 16 and the bonding layer 14. Examples of the substrate 12 include an aluminum board, an insulator substrate bonded to the aluminum board, and a circuit board. Example of the first metal layer 13 include one or two or more kinds of metals selected from the group consisting of gold, silver, and copper. As the second metal layer 15, a material that is the same as a material used for the first metal layer 13 may be used. Examples of the material to be bonded 16 include electronic components such as silicon (Si), silicon carbide (SiC), a semiconductor chip, and a LED element. The bonding layer 14 is brought into contact with the first metal layer 13 to form an interface 17, and the bonding layer 14 is brought into contact with the second metal layer 15 to form an interface 18. The thickness the bonding layer 14 is not particularly limited as long as it allows the substrate 12 to be bonded to the material to be bonded 16. For example, the thickness thereof may be 1 to 100 μm.

<Method for Producing Bonded Body>

A method for producing the bonded body 11 having such a configuration will be described based on FIG. 3. A metal is layered on a surface of the substrate 12 by a known method. Thus, the first metal layer 13 is layered. Similarly, the second metal layer 15 is layered on a surface of the material to be bonded 16. A method for layering a metal on the surfaces of the substrate 12 and the material to be bonded 16 is not particularly limited. Examples of the method include a vacuum evaporation method, a sputtering method, a plating method, and a printing method. Subsequently, the paste-like metal particle aggregate composition is applied to a surface of the first metal layer 13 by a known method, to form a paste layer. A method for applying the paste-like metal particle aggregate composition to the surface of the first metal layer 13 is not particularly limited. Examples thereof include a spin coating method, a metal mask method, and a screen printing method. On the paste layer formed on the surface of the first metal layer 13, the material to be bonded 16 is mounted so as to face the second metal layer 15, and is subjected to a heat treatment. As a result, the paste layer becomes the bonding layer 14. The first metal layer 13 is bonded to the second metal layer 15 through the bonding layer 14, to produce the bonded body 11.

Herein, the heating temperature of the heat treatment is preferably 120° C. or higher, and further preferably within a range of 120° C. or higher and 400° C. or lower. When the heating temperature falls within the aforementioned range, the bonding strength and long-term reliability of the bonding layer 14 can be enhanced. During the heat treatment, one of the substrate 12 and the material to be bonded 16 may be pressurized at a pressure of 10 MPa or less. By pressurization, the bonding layer 14 is made dense. Therefore, the bonding strength and long-term reliability can be enhanced. The heating time of the heat treatment is preferably 30 minutes or more. When the heating time is 30 minutes or more, the bonding strength and long-term reliability of the bonding layer 14 can be enhanced.

In the bonded body 11 thus produced, the bonding layer 14 is formed using the paste-like metal particle aggregate composition. Therefore, the bonding strength and long-term reliability of the bonding layer 14 are improved. Specifically, the first to third particles of the metal particles in the paste-like metal particle aggregate composition are produced at the same reaction field, and therefore the first to third particles are covered with the same protective film. The protective films of the first to third particles are first detached at a relatively low temperature of 100° C. to 130° C., and the metal surfaces of the first to third particles are exposed. The metal powder surfaces of the second and third particles (nanoparticles) having a smaller particle diameter are preferentially activated, and these particles are sintered. At this time, the particle diameter becomes rate-determining. The first particles (submicron particles) having a larger particle diameter that are hardly sintered are also sintered when the temperature is increased to 150° C. to 200° C. As a result, the bonding layer 14 having high bonding strength and long-term reliability can be sintered at a relatively low temperature of about 150° C. Specifically, the bonding strength (shear strength) of the bonding layer 14 is preferably 20 MPa or more, and more preferably 25 MPa or more.

In measurement of bonding strength, for example, a commercially available bonding tester (e.g., manufactured by RHESCA CO., LTD.) can be used.

EXAMPLES

Hereinafter, Examples of the present invention will be described in detail with Comparative Examples.

Example 1

Figure 4:
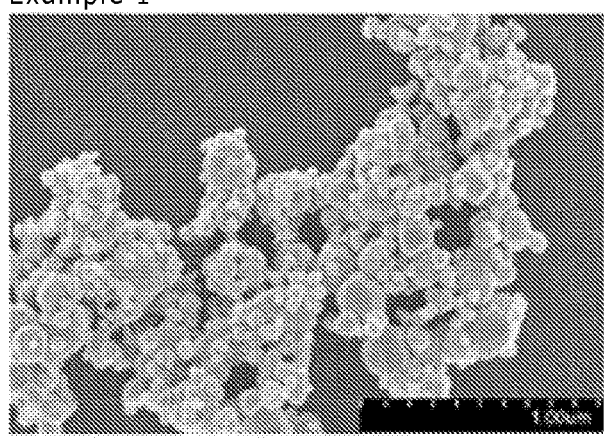
FIG. 4 is a scanning electron microscope (SEM) photograph showing a metal particle aggregate in Example 1.

As illustrated in FIG. 1, 900 g of silver nitrate aqueous solution (metal salt aqueous solution) 1 held at 30° C. and 600 g of triammonium citrate aqueous solution (carboxylate aqueous solution) 2 held at 30° C. were simultaneously added dropwise to 1,200 g of ion-exchanged water (water) 3 held at 30° C. over 60 minutes. As a result, a silver citrate slurry (metal carboxylate slurry) 4 was prepared. While the silver nitrate aqueous solution 1 and the triammonium citrate aqueous solution 2 were added dropwise to the ion-exchanged water 3, the ion-exchanged water 3 was continuously stirred. The concentration of silver nitrate in the silver nitrate aqueous solution 1 was 66% by mass, and the concentration of citric acid in the triammonium citrate aqueous solution 2 was 56% by mass. As illustrated in FIG. 2, 300 g of ammonium formate aqueous solution (aqueous solution of organic reductant) 5 was added dropwise to the silver citrate slurry 4, to obtain a mixed slurry. The concentration of formic acid in the ammonium formate aqueous solution 5 was 58% by mass. Subsequently, the mixed slurry was subjected to a certain heat treatment for reduction. Specifically, the mixed slurry was subjected to the heat treatment for reduction in which the temperature was increased to a maximum temperature of 70° C. at a temperature increasing rate of 20° C./hour, kept at 70° C. (maximum temperature) for 2 hours, and decreased to 30° C. As a result, a metal particle aggregate was obtained. The metal particle aggregate was put into a centrifugal separator, and rotated at a rotation speed of 3,000 rpm for 10 minutes. As a result, a liquid phase of the metal particle aggregate was removed, to obtain the dehydrated and desalted metal particle aggregate. The dehydrated and desalted metal particle aggregate was dried for 30 hours by lyophilization, to obtain a metal powder including the metal particle aggregate. This metal powder was assumed as Example 1. The metal powder in Example 1 was an aggregate in which the metal particles were aggregated as illustrated in FIG. 4.

Example 2

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 20° C./hour, kept at 70° C. (maximum temperature) for 2.2 hours, and decreased to 30° C. This metal powder was assumed as Example 2.

Example 3

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 20° C./hour, kept at 70° C. (maximum temperature) for 2.5 hours, and decreased to 30° C. This metal powder was assumed as Example 3.

Example 4

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 15° C./hour, kept at 70° C. (maximum temperature) for 2 hours, and decreased to 30° C. This metal powder was assumed as Example 4.

Example 5

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 40° C./hour, kept at 70° C. (maximum temperature) for 2 hours, and decreased to 30° C. This metal powder was assumed as Example 5.

Example 6

A metal powder including a metal particle aggregate was obtained in the same manner as in Example 1 except that a mixed slurry was subjected to a heat treatment for reduction in which the temperature was increased to a maximum temperature of 65° C. at a temperature increasing rate of 20° C./hour, kept at 65° C. (maximum temperature) for 3 hours, and decreased to 30° C. This metal powder was assumed as Example 6.

Example 7

A metal powder including a metal particle aggregate was obtained in the same manner as in Example 1 except that a mixed slurry was subjected to a heat treatment for reduction in which the temperature was increased to a maximum temperature of 85° C. at a temperature increasing rate of 20° C./hour, kept at 85° C. (maximum temperature) for 2 hours, and decreased to 30° C. This metal powder was assumed as Example 7.

Comparative Example 1

Figure 5:
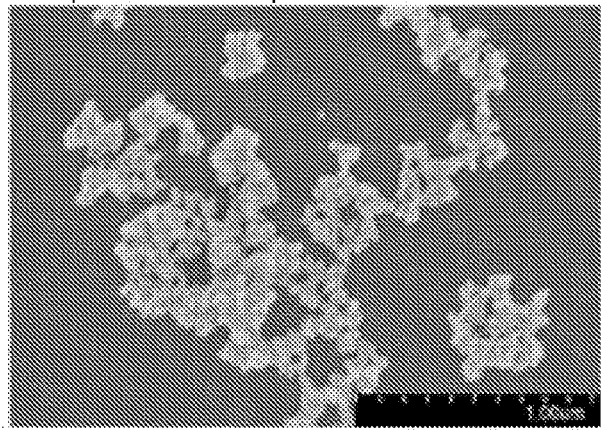
FIG. 5 is a scanning electron microscope (SEM) photograph showing a metal particle aggregate in Comparative Example 1.

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 20° C./hour, kept at 70° C. (maximum temperature) for 1.5 hours, and decreased to 30° C. This metal powder was assumed as Comparative Example 1. The metal powder in Comparative Example 1 was an aggregate in which the metal particles were aggregated as illustrated in FIG. 5.

Comparative Example 2

Figure 6:
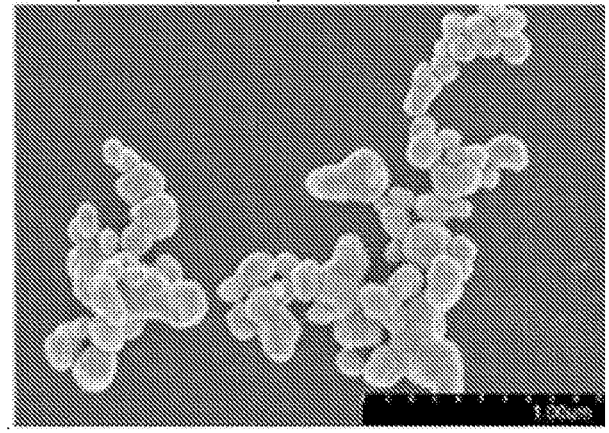
FIG. 6 is a scanning electron microscope (SEM) photograph showing a metal particle aggregate in Comparative Example 2.

A metal powder including a metal particle aggregate was obtained in the same manner as in Example 1 except that a mixed slurry was subjected to a heat treatment for reduction in which the temperature was increased to a maximum temperature of 70° C. at a temperature increasing rate of 20° C./hour, kept at 70° C. (maximum temperature) for 20 hours, and decreased to 30° C. This metal powder was assumed as Comparative Example 2. The metal powder in Comparative Example 2 was an aggregate in which the metal particles were aggregated as illustrated in FIG. 6.

Comparative Example 3

Figure 7:
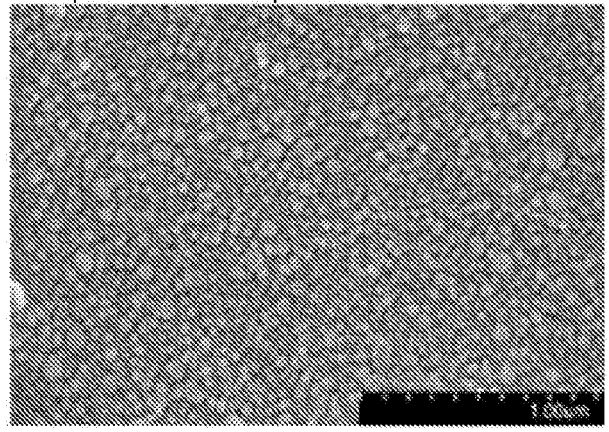
FIG. 7 is a scanning electron microscope (SEM) photograph showing monodispersed metal particles in Comparative Example 3.

A mixture containing alkylamine and a metal compound was thermally decomposed to obtain a metal powder including monodispersed metal particles (nanoparticles). This metal powder was assumed as Comparative Example 3. A protective film covering each metal particle of the metal powder was rigid for monodispersing the metal particles. The metal powder of Comparative Example 3 was metal particles in which nanoparticles were monodispersed, as illustrated in FIG. 7.

Comparative Example 4

Figure 8:
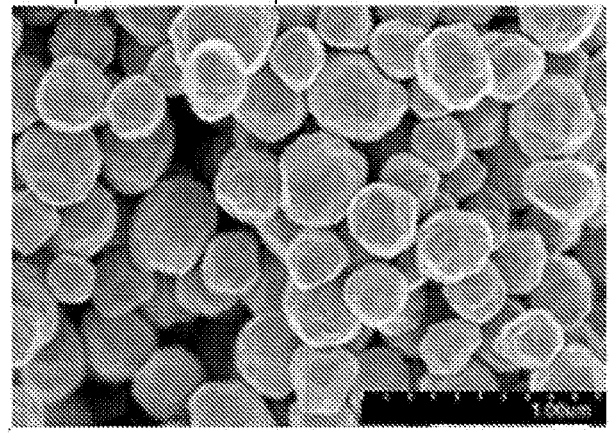
FIG. 8 is a scanning electron microscope (SEM) photograph showing monodispersed metal particles in Comparative Example 4.

By a wet reduction process in which reduction is carried out using hydrazine through a metal amine complex, metal particles including monodispersed metal particles (submicron particles) were obtained. This metal powder was assumed as Comparative Example 4. A protective film covering each metal particle of the metal powder was rigid for monodispersing the metal particles. The metal powder of Comparative Example 4 was metal particles in which submicron particles were monodispersed, as illustrated in FIG. 8.

Comparative Test 1

For the metal powders in Examples 1 to 7 and Comparative Examples 1 to 4, the particle size distribution of the metal particles and the particle size distribution of the metal aggregates were determined, and the detachment temperatures of the protective films on the surface of the metal particles were measured. The results are shown in Table 1.

The particle size distribution of the metal particles was determined as follows. images of 500 metal particle aggregates were obtained using a scanning electron microscope (SEM), and the particle diameter of metal particles in each of the metal particle aggregates was measured. At that time, the magnification of SEM was 100,000. From the SEM images of the 500 metal particle aggregates, the metal particles in which the whole profile of the metal particles (primary particles) can be visually recognized were extracted. Subsequently, the projected areas of the extracted metal particles were measured using an image processing soft (Image-J), and the diameters equivalent to a circle were calculated from the obtained projected areas as the particle diameters of the metal particles. For the metal particles including a profile that cannot be visually recognized, the diameter equivalent to a circle was not measured. The metal particles were classified into the first particles having a particle diameter of 100 nm or more and less than 500 nm, the second particles having a particle diameter of 50 nm or more and less than 100 nm, the third particles having a particle diameter of less than 50 nm, and fourth particles having a particle diameter of 500 nm or more, and the content ratios of the first to fourth particles by number were calculated.

The particle size distribution of the metal particle aggregate was determined as follows. 0.1 g of the metal particle aggregate was added to 20 g of ion-exchanged water, irradiated with ultrasonic wave of 25 kHz for 5 minutes, and dispersed in the ion-exchanged water. Subsequently, an appropriate amount of the obtained dispersion liquid of the metal particle aggregate was added to an observation cell of a laser diffraction scattering particle size distribution analyzer (LA-960 manufactured by HORIBA Ltd.), and the particle size distribution was measured in accordance with a procedure of this analyzer. The particle size distribution measured by a laser diffraction scattering method is the particle size distribution of metal particle aggregate (secondary particles) in which an aggregate of metal particles (primary particles) is considered as one particle.

Further, the detachment temperature of the protective film on the surface of the metal particles was measured using a thermogravimetric/differential thermal analyzer (TG-DTA). Specifically, a heat generation peak was measured by differential thermal analysis (DTA) of the thermogravimetric/differential thermal analyzer, and at the same time, weight loss was measured by thermogravimetric analysis (TG). From the both measured values, a weight loss initiation temperature was calculated as a detachment temperature.

Using the metal powders in Examples 1 to 7 and Comparative Examples 1 to 4, paste-like compositions (paste-like metal particle aggregate composition or paste-like metal particle composition) were prepared. Specifically, each of the metal powders and ethyleneglycol were mixed at a mass ratio of 70:30. The obtained mixtures were each kneaded using a a three-roll mill, to the paste-like compositions in Examples 1 to 7 and Comparative Examples 1 to 4.

Comparative Test 2

The viscosity of each of the paste-like compositions in Examples 1 to 7 and Comparative Examples 1 to 4 was measured. The results are shown in Table 1. A viscosity (Pa·s) was measured three times by a rheometer (DHR-3, manufactured by TA Instruments.) at a measurement temperature of 25° C. and a shear rate of 10 (1/s), and an average value thereof was used as the viscosity of each of the paste-like compositions.

Next, a bonded body was produced using each of the pasty compositions in Examples 1 to 7 and Comparative Examples 1 to 4. Specifically, as illustrated in FIG. 3, a 20-mm square copper substrate 12 (thickness: 1 mm) of which the outermost surface was gold-plated (first metal layer) 13 was prepared as a first member, and a material to be bonded 16 including a 2.5-mm square silicon wafer (thickness: 200 μm) of which the outermost surface was gold-plated (second metal layer) 15 was prepared as a second member. The paste-like composition was then applied to the gold-plated surface 13 of the substrate 12 by a metal mask method, to form a paste layer. Further, the material to be bonded 16 was mounted on the paste layer so that the gold-plating 15 was in contact with the paste layer. A bonded body 11 in which the substrate 12 was bonded to the material to be bonded 16 through the bonding layer 14 was produced by heating at a temperature of 150° C. for 60 minutes, and a bonded body 11 in which the substrate 12 was bonded to the material to be bonded 16 through the bonding layer 14 was produced by heating at a temperature of 250° C. for 60 minutes. The bonded bodies were the bonded bodies in Examples 1 to 7 and Comparative Examples 1 to 4.

Comparative Test 3

The bonding strength (shear strength) of the bonded body 11 obtained as the bonded bodies in Examples 1 to 7 and Comparative Examples 1 to 4 was measured. The results are shown in Table 1. The bonding strength (shear strength) of the bonded body 11 was measured as follows by a shear strength evaluation tester (bonding tester manufactured by RHESCA CO., LTD. (Model: PTR-1101). The substrate (first member) 12 of the bonded body 11 was fixed horizontally. Subsequently, at a position of 50 μm above surface of the bonding layer 14, the material to be bonded (second member) 16 was pushed in a horizontal direction from the side using a shear tool. The strength at which the material to be bonded (second member) 16 is ruptured was measured. The movement rate of the shear tool was 0.1 mm/sec. The strength measurement was carried out three time under each condition. An arithmetic average value was obtained as a measured value. The results are shown in Table 1.

TABLE 1-1

| | Metal powder | | Particle size distribution of metal particles (% by number) | | | |
|---|---|---|---|---|---|---|
| | Kind of metal | Powder structure | First particles 100 to 500 nm | Second particles 50 to 100 nm | Third particles Less than 50 nm | Fourth particles 500 nm or more |
| Example 1 | Ag | Particle aggregate | 28 | 64 | 8 | 0 |
| Example 2 | Ag | Particle aggregate | 25 | 61 | 14 | 0 |
| Example 3 | Ag | Particle aggregate | 21 | 57 | 22 | 0 |
| Example 4 | Ag | Particle aggregate | 28 | 60 | 12 | 0 |
| Example 5 | Ag | Particle aggregate | 20 | 55 | 25 | 0 |
| Example 6 | Ag | Particle aggregate | 22 | 54 | 24 | 0 |
| Example 7 | Ag | Particle aggregate | 27 | 64 | 7 | 0 |
| Comparative Example 1 | Ag | Particle aggregate | 3 | 27 | 70 | 0 |
| Comparative Example 2 | Ag | Particle aggregate | 90 | 10 | 0 | 0 |
| Comparative Example 3 | Ag | Single dispersion | 0 | 2 | 98 | 0 |
| Comparative Example 4 | Ag | Single dispersion | 88 | 0 | 0 | 12 |

TABLE 1-2

| | Particle size distribution of metal aggregate Volume D50 nm | Detachment temperature of protective film ° C. | Viscosity of paste-like composition Pa·s | Shear strength (MPa) | |
|---|---|---|---|---|---|
| | | | | Firing at 150° C. | Firing at 250° C. |
| Example 1 | 580 | 110 | 30 | 25 | 40 |
| Example 2 | 620 | 108 | 25 | 26 | 44 |
| Example 3 | 530 | 108 | 25 | 25 | 43 |
| Example 4 | 600 | 110 | 25 | 28 | 45 |
| Example 5 | 550 | 108 | 35 | 27 | 40 |
| Example 6 | 510 | 107 | 34 | 26 | 45 |
| Example 7 | 650 | 110 | 22 | 22 | 39 |
| Comparative Example 1 | 550 | 104 | 48 | 28 | 39 |
| Comparative Example 2 | 2000 | 125 | 14 | 4 | 17 |
| Comparative Example 3 | 40 | 200 | 65 | 0 | 50 |
| Comparative Example 4 | 400 | 205 | 8 | 0 | 5 |

<Evaluations>

As seen from Table 1, in the bonded body using the metal powder in Comparative Example 1 in which the total amount of the second particles having a particle diameter of 50 nm or more and less than 100 nm and the third particles having a particle diameter of less than 50 nm is as too large as 97% by number, the detachment temperature of the protective film is as relatively low as 104° C., and the shear strengths in firing at 150° C. and 250° C. are as good as 28 MPa and 39 MPa, respectively. However, the viscosity of the paste-like composition is as too high as 48 Pa·s, and the printing properties are deteriorated. In the bonded body using the metal powder in Comparative Example 2 in which the total amount of the second particles having a particle diameter of 50 nm or more and less than 100 nm and the third particles having a particle diameter of less than 50 nm is as too small as 10% by number, the viscosity of the paste-like composition is as low as 14 Pa·s, and the printing properties are improved. The shear strength in firing at 150° C. is as very low as 4 MPa, and the shear strength in firing at 250° C. is increased to 17 MPa. The sintering properties were not developed until the firing temperature was increased to 250° C. In the bonded body using the metal powder in Comparative Example 3 in which the nanoparticles were covered with a rigid protective film for monodispersing, the viscosity of the paste-like composition is as too high as 65 Pa·s, the printing properties are deteriorated, and the shear strength in firing at 150° C. is 0 MPa. The low-temperature sintering properties of small particle diameter of the nanoparticles are not developed. The shear strength was increased to 50 MPa when the firing temperature was increased to about 250° C. In the bonded body using the metal powder in Comparative Example 4 in which the submicron particles were covered with a rigid protective film for monodispersing, the viscosity of the paste-like composition is as low as 8 Pa·s, and the printing properties are good. The shear strengths in firing at 150° C. and 250° C. are as very low as 0 MPa and 5 MPa, respectively. The low-temperature sintering properties were not developed.

In contrast, in the bonded bodies using the metal powders in Examples 1 to 7 in which the total amount of the second particles having a particle diameter of 50 nm or more and less than 100 nm and the third particles having a particle diameter of less than 50 nm is 72 to 80% by number, which is an appropriate range (70 to 80% by number), the detachment temperature of the protective film is as relatively low as 107 to 110° C., the viscosity of the paste-like compositions is as low as 22 to 35 Pa·s, the printing property are good, and the shear strengths in firing at 150° C. and 250° C. are 22 to 28 MPa and 39 to 45 MPa, respectively, which are both good.

INDUSTRIAL APPLICABILITY

The metal particle aggregate of the present invention can be used for bonding a circuit substrate to a semiconductor chip, bonding a circuit substrate to a LED element without pressurization, or the like.

DESCRIPTION OF SYMBOLS

11 Bonded body
12 Substrate (first member)
14 Bonding layer
16 Material to be bonded (second member)

The invention claimed is:

1. A metal particle aggregate comprising:
   metal particles including first particles that contain one or both of silver and copper in an amount of 70% by mass or more relative to 100% by mass of all metals and have a particle diameter of 100 nm or more and less than 500 nm at a ratio of 20 to 30% by number, and second particles that have a particle diameter of 50 nm or more and less than 100 nm, and third particles that have a particle diameter of less than 50 nm at a ratio of 80 to 70% by number in total; and
   an organic substance, and
   surfaces of the first to third particles are covered with the same protective film.

2. The metal particle aggregate according to claim 1, wherein the second particles are contained at a ratio of 55 to 65% by number, and the third particles are contained at a ratio of 5 to 25% by number.

3. A method for producing metal particle aggregate comprising steps of:
   adding dropwise a metal salt aqueous solution containing one or both of silver and copper and a carboxylate aqueous solution to water, to prepare a metal carboxylate slurry;
   adding dropwise an aqueous solution of organic reductant to the metal carboxylate slurry, and performing a heat treatment for reduction in which a temperature is increased to a predetermined temperature within a range of 65° C. or higher and 85° C. or lower at a temperature increasing rate of more than 15° C./hour and 40° C./hour or less and kept at this temperature for 2 hours or more and 3 hours or less to generate and aggregate metal particles into a metal particle aggregate; and
   drying the metal particle aggregate,
   wherein the metal particles in the metal particle aggregate contain first particles that contain one or both of silver and copper in an amount of 70% by mass or more relative to 100% by mass of all metals and have a particle diameter of 100 nm or more and less than 500 nm at a ratio of 20 to 30% by number, and second particles that have a particle diameter of 50 nm or more and less than 100 nm, and third particles that have a particle diameter of less than 50 nm at a ratio of 80 to 70% by number in total.

4. The method for producing a metal particle aggregate according to claim 3, wherein the second particles are contained at a ratio of 55 to 65% by number, and the third particles are contained at a ratio of 25 to 5% by number.

5. A paste-like metal particle aggregate composition comprising the metal particle aggregate according to claim 1, and a volatile solvent.

6. A method for producing a bonded body by bonding a first member and a second member through a bonding layer, wherein the bonding layer is formed using the paste-like metal particle aggregate composition according to claim 5.

7. A paste-like metal particle aggregate composition comprising the metal particle aggregate according to claim 2, and a volatile solvent.

8. A method for producing a bonded body by bonding a first member and a second member through a bonding layer, wherein the bonding layer is formed using the paste-like metal particle aggregate composition according to claim 6.

* * * * *